United States Patent
Li et al.

[11] Patent Number: 6,020,234
[45] Date of Patent: Feb. 1, 2000

[54] INCREASING CAPACITANCE FOR HIGH DENSITY DRAM BY MICROLITHOGRAPHY PATTERNING

[75] Inventors: Mei-Yen Li, Hsin-chu; Ding-Dar Hu, Taichung; Li-chun Chen, Hsin-chu, all of Taiwan

[73] Assignee: Taiwan Semiconductor Manufacturing Company, Hsin-Chu, Taiwan

[21] Appl. No.: 09/035,051

[22] Filed: Mar. 5, 1998

[51] Int. Cl.[7] .................................................. H01L 21/8242
[52] U.S. Cl. ............................................. 438/253; 438/254
[58] Field of Search ................................... 438/250–256, 438/390–399

[56] References Cited

U.S. PATENT DOCUMENTS

| | | | |
|---|---|---|---|
| 5,336,630 | 8/1994 | Yun et al. | 437/52 |
| 5,387,531 | 2/1995 | Rha et al. | 437/52 |
| 5,604,148 | 2/1997 | Lur | 437/60 |
| 5,744,390 | 4/1998 | Chao | 438/254 |
| 5,763,304 | 6/1998 | Tseng | 438/239 |
| 5,879,985 | 3/1999 | Gambino et al. | 438/253 |

Primary Examiner—Jey Tsai
Attorney, Agent, or Firm—George O. Saile; Stephon B. Ackerman

[57] ABSTRACT

A method is disclosed for increasing the capacitance of high-density DRAM devices by microlithographic patterning. A semiconductor substrate having a MOS transistor comprising a gate and source/drain regions, and a word line and a bit line is provided. A layer of inter-poly oxide is deposited over the substrate and planarized. Contact holes are etched in the oxide layer until the substrate is exposed. A layer of photoresist is next blanket deposited over the substrate. Using microlithographic methods, the photoresist is then patterned with in-line or staggered micron size features and the underlying inter-poly oxide layer is etched using the photoresist as a mask. The resulting inter-poly oxide surface, therefore, acquires the shape of a micro-folded topography having a roughened surface area of many folds larger than the original flat surface. A first conductive layer such as polysilicon is conformally deposited over the microlithoqraphically roughened surface forming the storage electrode of the capacitor which is completed by forming a high dielectric oxide such as ONO over the first polysilicon and then depositing a second polysilicon to form the upper electrode of the capacitor.

14 Claims, 5 Drawing Sheets

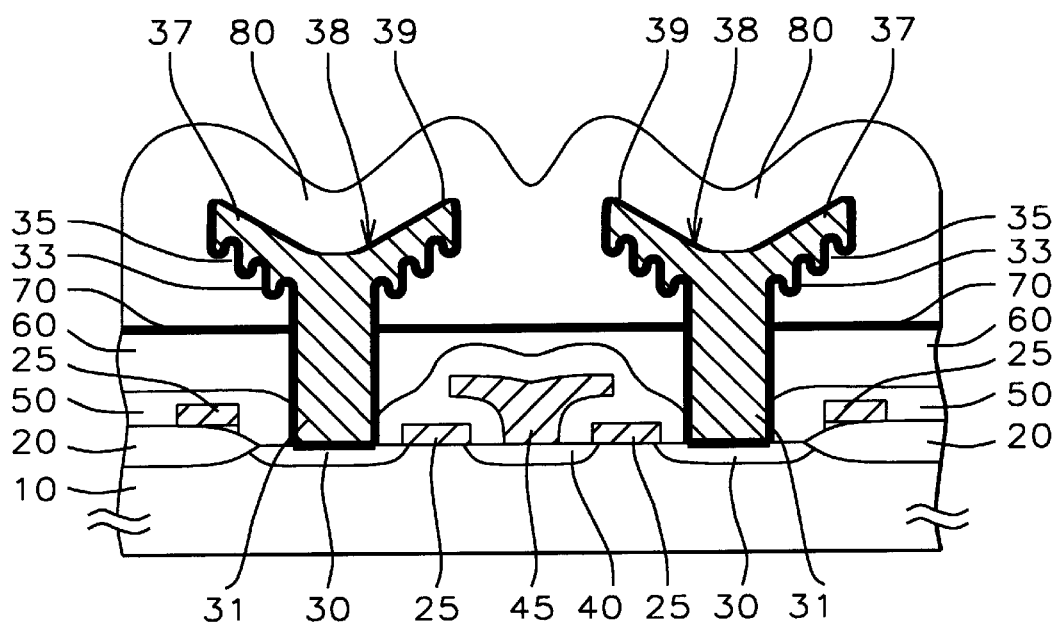
FIG. 1 – Prior Art
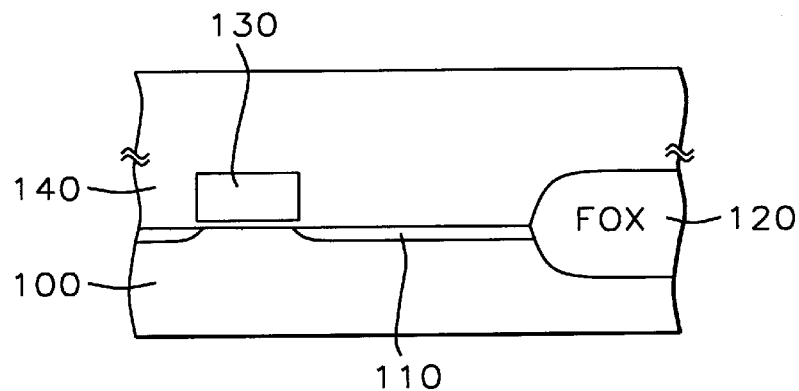
FIG. 2a
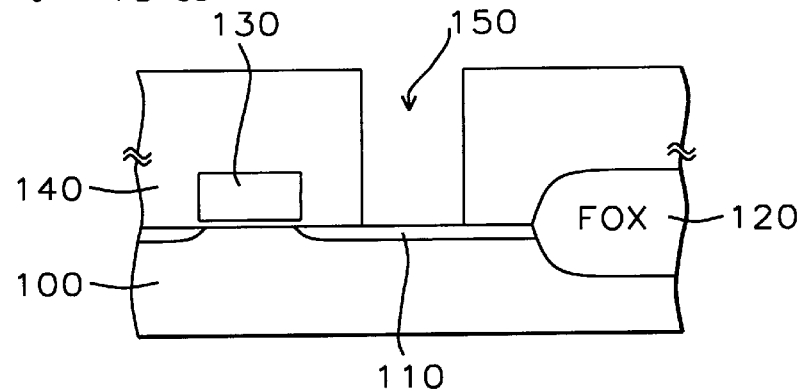
FIG. 2b

INCREASING CAPACITANCE FOR HIGH DENSITY DRAM BY MICROLITHOGRAPHY PATTERNING

BACKGROUND OF THE INVENTION (1) Field of the Invention

The present invention relates generally to capacitors in semiconductor memory devices and more particularly to a method of manufacturing a high capacitance storage electrode for ULSI DRAMs.

(2) Description of the Related Art

In the ultra large scale integrated (ULSI) technology of today, the ultra scaling down of the physical area of circuitry on a semiconductor substrate has placed a greater technological demand on the dynamic random access memory (DRAM) devices. This is because, as the areas occupied by the memory cells have been scaled down over the years, the minimum amount of stored charge needed to maintain reliable memory operation has remained the same. And yet, the capacitance is directly proportional to the area of the capacitor. This constant charge-storage value has to be maintained for future DRAM generations as well even as the cell sizes shrink even further.

As is well known in the art, the storage capacity of capacitors in memory cells can be increased by making the capacitor dielectric thinner, by using an insulator with a larger dielectric constant, or by increasing the area of the capacitor. The third option of increasing the capacitor area can be effective and has been exploited in certain different ways. One way is to form three-dimensional structures in place of planar capacitors. In this approach, the storage capacitor is formed in a trench etched in a semiconductor substrate. The silicon-area reduction of a trench capacitor compared to a planar capacitor can be a factor of eighteen or more, for example. Alternatively, the storage capacitor of a cell can be formed, or stacked, on top of its access transistor, thereby shrinking the cell size without a loss of its storage capacity. In still another approach, a three-dimensional tree-like effect can be realized by forming a finned structure with leaves extending from the same capacitor trunk. Many variations of such three-dimensional capacitors are reported in prior art.

General usage of trench structures are well known in isolation technology where they are used to isolate devices in integrated circuits. There are differences in these structures, however, when they are used for DRAM capacitors, in particular. As stated earlier, storage capacity is inversely proportional to the dielectric thickness, and therefore, in the case of a trench capacitor, the dielectric film on the walls of the trench must be much thinner than on the walls of an isolation trench. Also, since polysilicon is usually used as the filler material in the trench, and since in the case of a trench capacitor this material also serves as one plate of the capacitor, it must consist of highly doped polysilicon. Usually the semiconductor on the other side of the thin dielectric serves as the other capacitor plate. The role of the polysilicon inside the trench as the storage electrode or plate electrode will vary depending upon the particular design used.

Similar considerations as in trench-capacitors apply when three-dimensional capacitors are formed above the access transistors on a semiconductor substrate. In prior art, some of these structures are referred to as stacked capacitors (STCs). As usual, the properties of the dielectric, and the area of the capacitor play a significant role in determining the storage capacity. Thus, for STC cells to be made feasible for high-density DRAMs of 64 Mega-bit and beyond, an insulator with a larger dielectric constant than that of $SiO_2$ must be made available, or novel structures must be developed. In the absence of the former presently, several novel STC cells have been reported in the literature.

A very recent STC is a three-dimensional finned structure forming a tree-like capacitor which is shown in FIG. 1. Different methods of manufacturing essentially the same structure are disclosed in various patents. A conventional method of forming such a capacitor follows the steps described by Lur, for example, in U.S. Pat. No. 5,604,148. Following Lur, but without going into unnecessary details so as to not obscure the main features of forming three-dimensional capacitors, it is sufficient to note in FIG. 1 the tree-like structure (38) and its formation as follows: first, an active region in a semiconductor substrate (10) is isolated from other active regions by forming field oxide regions (20) using commonly practiced isolation methods such as LOCOS (local oxidation of silicon). Subsequently, transistors having a source(30) and drain (40) regions, and a gate electrode (25) and commonly shared bit line (45) are formed in the active region using again common semiconductor manufacturing methods such as deposition, photolithography, and ion-implantation.

The structure so formed is then conformally deposited with a first insulating layer (50), and then followed by a second insulating layer including upper (not shown) and lower insulating layers where the lower layer (70) is an etch-blocking layer (70), such as silicon nitride ($Si_3N_4$). In FIG. 1, an intermediate insulating layer (60) is also shown which is sometimes used for planarizing the underlying layer. A contact hole is next formed over the source region (30) and filled with a conductive material forming a metal trunk (31). The upper layer of the second insulating layer surrounding trunk (31) is then removed and the space around the metal trunk is filled with alternating rings of conductive material (33) and insulating material (35) such that when a metal cap (37) is formed in mating disposition with the metal ring layers, a three-dimensional tree-shaped lower electrode (38) is formed as shown in FIG. 1. Finally, upper electrode (80) is formed after depositing a thin layer of dielectric (39) over the surface of the lower electrode comprising metal parts (31) and (37), thus forming a capacitor.

Another method of forming capacitors with increased electrode surface is taught by Rha in U.S. Pat. No. 5,387,531. In this approach, after the forming of a MOS transistor, three different layers are deposited in the order of an in-situ doped non-crystalline silicon, an undoped non-crystalline silicon, and a hemispherical polysilicon. An upper oxide film is next deposited, and then, etched back so that the hemispherical polysilicon domes are exposed. Using the remained portions of the upper oxide film remaining in the valleys of hemispherical polysilicon as a mask, the polysilicon is etched to form a plurality of holes perforated from the domes to the underlying insulating layer. Thus, the polysilicon layer with the holes, and hence with increased area, become the lower electrode of a stack capacitor. The upper electrode is formed after coating the lower electrode with a high dielectric layer such as oxynitride ONO, and depositing a conducting material.

In U.S. Pat. No. 5,336,630, Yun describes a different method of making a semiconductor memory device where the storage node having a plurality of pillars is capable of increasing the storage node surface area and thus the cell capacitance. This method, which utilizes a direct electron beam patterning of a photoresist layer is simpler than the previously cited prior art methods. A still simpler method is proposed in this invention where larger gain can be achieved in increasing the area of the storage electrode of a memory device by employing a microphotolithographic patterning technique as disclosed below in the embodiment of this invention.

SUMMARY OF THE INVENTION

It is therefore an object of this invention to provide a manufacturing process for forming a storage electrode having a micro-folded surface with more area than that of the conventional capacitors in High-Density DRAMs.

It is another object of this invention to provide a microlithographic method of increasing capacitance in High-Density DRAMs.

It is a further object of the present invention to provide a highly integrated stacked DRAM cell with high packing density.

These objects are achieved by providing a semiconductor substrate having a switching MOS transistor comprising a gate and source/drain regions, and a word line and a bit line. A layer of inter-poly oxide is deposited over the substrate and planarized. Contact holes are etched in the oxide layer until the substrate is exposed. A layer of photoresist is next blanket deposited over the substrate. Using microlithographic methods, the photoresist is then patterned with in-line or staggered micron size features and the underlying inter-poly oxide layer is etched using the photoresist as a mask. The resulting inter-poly oxide surface, therefore, acquires the shape of a micro-folded topography having a roughened surface area of many folds larger than the original flat surface. A first conductive layer such as polysilicon is conformally deposited over the microlithographically roughened surface forming the storage electrode of the capacitor which is completed by forming a thin high dielectric oxide such as ONO over the first polysilicon and then depositing a second polysilicon to form the upper electrode of the capacitor.

BRIEF DESCRIPTION OF THE DRAWINGS

FIG. 1 a cross-sectional view of a semiconductor substrate showing a tree-like structure of a storage electrode of prior art.

FIGS. 2a is a partial cross-sectional view of a semiconductor substrate showing the depositing of an inter-poly oxide layer over a MOS transistor of this invention.

FIG. 2b is a partial cross-sectional view of the semiconductor substrate of FIG. 2a showing the forming of a contact hole through the inter-poly oxide layer and over a source/drain region according to this invention.

DESCRIPTION OF THE PREFERRED EMBODIMENTS

Figure 2C:
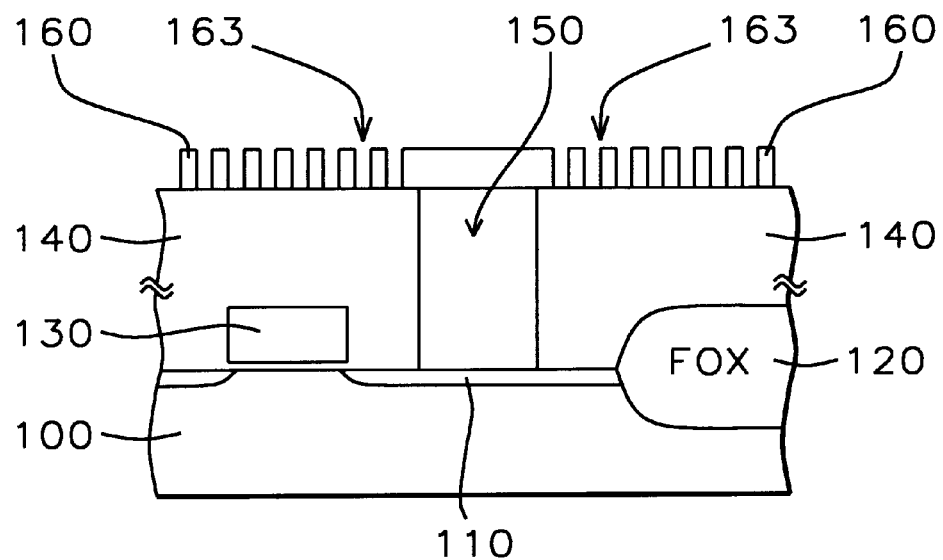
FIG. 2c is a partial cross-sectional view of the semiconductor substrate of FIG. 2b showing the patterning of a photoresist layer covering the inter-poly oxide layer of this invention.

Referring now to the drawings, in particular to FIGS. 2a–2i, there are shown schematically steps of forming a lower storage electrode of a capacitor for a DRAM device.

In FIG. 2a, a substrate (100) having active and isolation regions (110) and (120), respectively, and a gate (130) is covered with a dielectric oxide layer (140). The structure shown in FIG. 2a is formed by employing methods well known in the art of semiconductor manufacturing, and therefore will not be further described so as to not unnecessarily obscure the main points of this invention. It will also be known to those skilled in the art that the oxide layer (140) is sometimes referred to as the inter-poly oxide because it is disposed between polysilicon layers, as it is described below. It is preferred that the inter-poly oxide is formed by depositing a layer of tetraethyl orthosilicate (TEOS) oxide with a chemical vapor deposition procedure that is either implanted with impurities or not, and having a thickness between about 8,000 to 12,000 angstroms (Å).

A capacitor area is next formed by dry etching a contact hole (150) through inter-poly oxide layer (140) over an active region (110) of the substrate as shown in FIG. 2b. Etching is accomplished with recipe comprising $CHF_3$ at a flow rate between about 20 to 90 sccm, $CF_4$ at a rate between 30 to 120 sccm, and Ar at a rate between about 300 to 800 sccm.

Then, a layer of photoresist (160) is deposited over the substrate and patterned as shown in FIG. 2c. As photoresist materials can widely vary in properties, it is important in this invention that these properties are commensurate with the requirements of microlithography where feature sizes between about 2,500 to 3,500 (Å) are used.

Figure 2D:
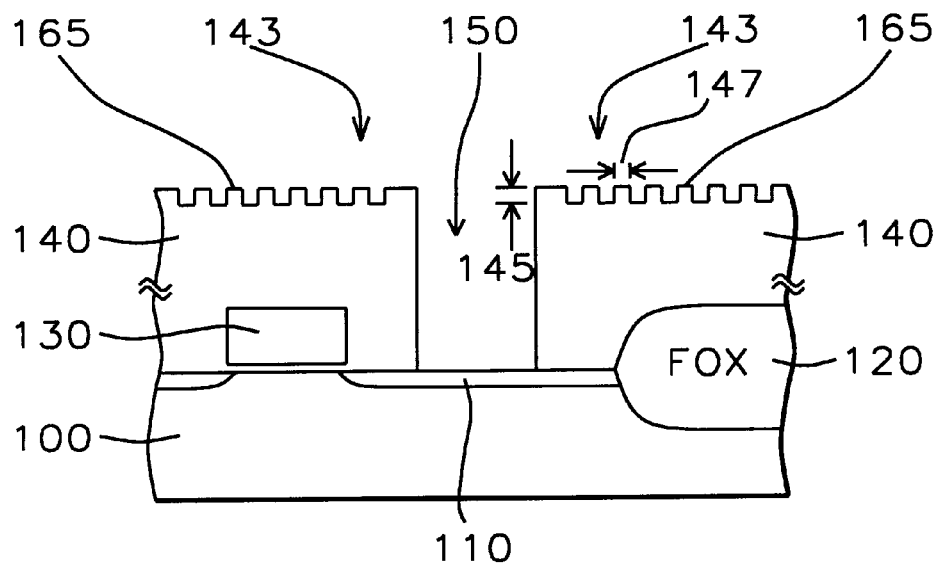
FIG. 2d is a partial cross-sectional view of the semiconductor substrate of FIG. 2c showing the etching of the inter-poly oxide layer using the photoresist layer as a mask according to this invention.
Figure 2E:
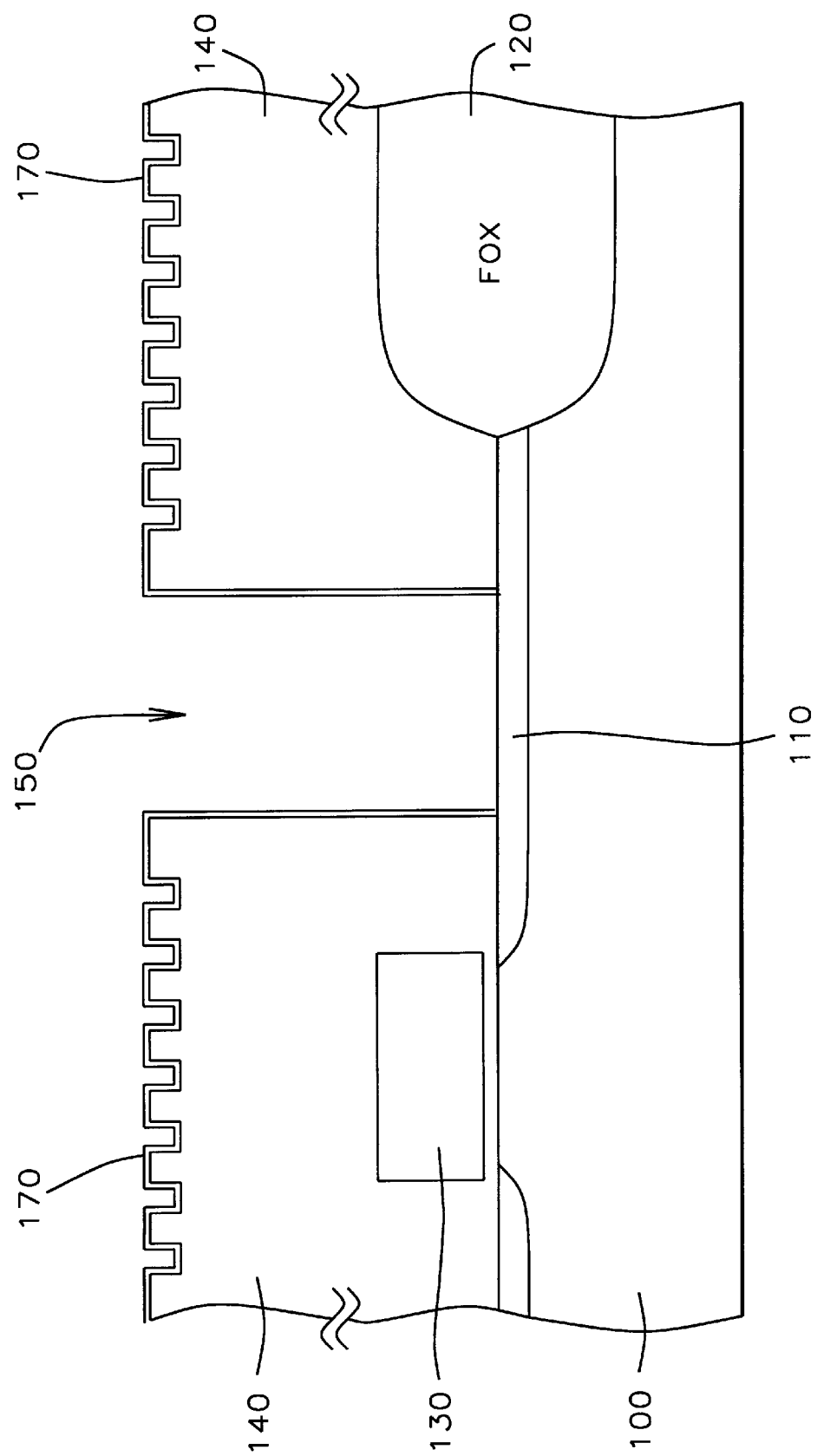
FIGS. 2e is a partial cross-sectional view of the semiconductor substrate of FIG. 2d after the depositing of a conformal polysilicon layer according to this invention.
Figure 2F:
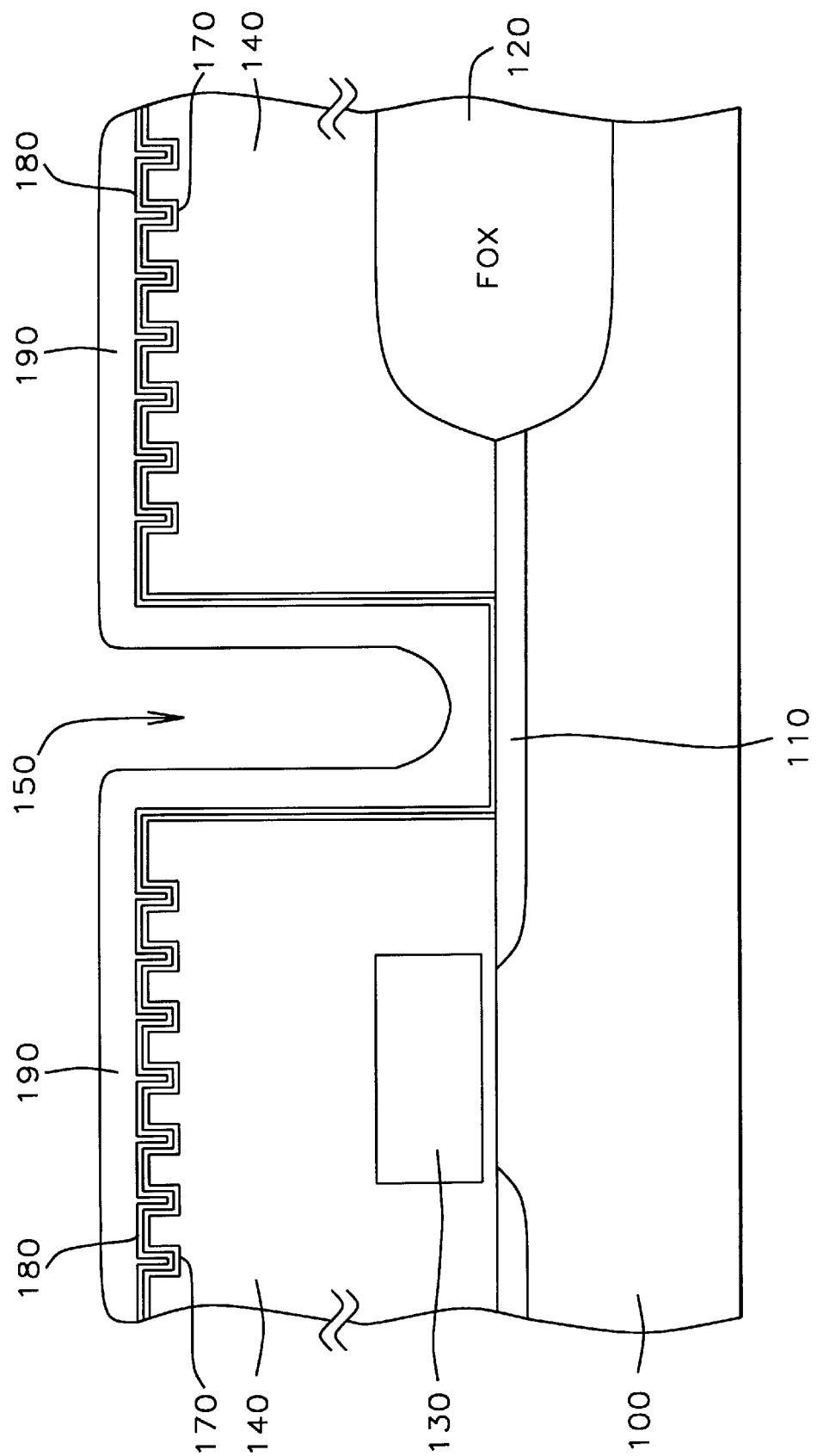
FIGS. 2f is a partial cross-sectional view of the semiconductor substrate of FIG. 2e after the forming of the upper plate node of the completed capacitor.
Figure 2G:
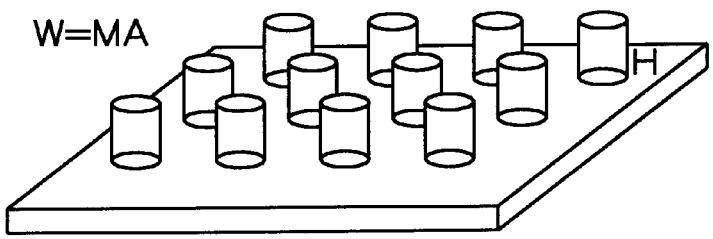
FIG. 2g is a perspective drawing showing the arrangement of right circular cylinders forming the micro-folded surface of the storage electrode of this invention.
Figure 2H:
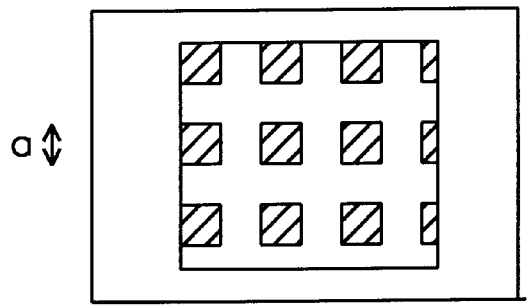
FIG. 2h is a top plan view of FIG. 2g showing in-line arrangement of the right circular cylinders of this invention.
Figure 2I:
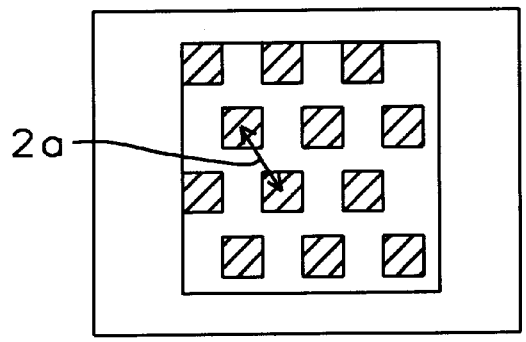
FIG. 2i is a top plan view of FIG. 2g showing a staggered arrangement of the right circular cylinders of this invention.

Different patterns with different features (163) can be used as shown in FIGS. 2g–2i and described later. It will be noted in FIG. 2c that it is not necessary to pattern the photoresist portion covering contact hole (150). Using the patterned photoresist (160) as a mask, the inter-poly oxide is next etched to a depth between about 4,000 to 6,000 (Å) with recipe comprising $CHF_3$ at a flow rate between about 20 to 90 sccm, $CF_4$ at a rate between 30 to 120 sccm, and Ar at a rate between about 300 to 800 sccm. After the removal of the photoresist, a roughened, micro-folded surface (145) of the inter-poly dielectric is obtained as shown in FIG. 2d.

Thereafter, a conformal layer of doped polysilicon (170) is deposited over the entire exposed surface of the inter-poly oxide to have a thickness between about 500 to 800 (Å) to form a storage node having substantially increased area. It is preferred that polysilicon (170) is doped with phosphorous.

A layer of high dielectric material (180) is next formed over the entire exposed surface of the storage node. Finally, the upper, plate node (190) is deposited on dielectric layer (180) to complete the capacitor of a DRAM as shown in FIG. 2f.

In the preferred embodiment of this invention, the micro-folded, roughened surface can be approximated by a pattern comprising right circular cylinders of height (h) spaced equidistantly across the surface as shown in FIGS. 2g and 2h. FIG. 2g is a perspective drawing of the right circular cylinders aligned in-line arrangement and FIG. 2h is a top plan view of the same cylinders. Designating the length, (l), and width, (w), and assuming that there are (m/2) number of such cylinders along the length and (n/2) number along the width and that the their spacing is the same as their diameter (a), then the projected area of the flat surface can be represented by lw=(ma/2)*(na/2). It can also be shown that the total lateral area of the cylinders is equal to $(\pi a)h(m/2)(n/2)=\pi ahmn/4$.

Thus, the total area presented by the flat horizontal and lateral vertical surfaces, that is, of the micro formed area, is equal to lw+πahmn/4 which reduces to $mna^2(1+\pi h/4a)$. The surface gained, therefore, is equal to:

(area of the micro formed surface)/(flat surface), or $$mna^2(1+\pi h/4a)/(a^2mn)=1+(\pi h)/(4a)$$

The surface area of the storage electrode can be further increased by forming the micro-folded surface in a diagonally staggered pattern as shown in FIG. 2*i* where the diagonal spacing is equal to the diameter of the right circular cylinders. In that case, it can be shown that the gained surface area becomes $$1+(\pi h)/(3a).$$

It follows from either one of the expressions above that it is possible to increase greatly the surface of the storage electrode by increasing the etched depth h, (145), or by employing finer microphotolithographic techniques to reduce dimension a, (147) shown in FIG. 2*d*.

It will be appreciated that in addition to being able to increase the area of the storage electrode by microphotolithographic means, the method employed is simplified greatly because the patterning of the inter-poly oxide in itself is not complicated according to this invention.

While the invention has been particularly shown and described with reference to the preferred embodiments thereof, it will be understood by those skilled in the art that various changes in form and details may be made without departing from the spirit and scope of the invention.

What is claimed is:

1. A microlithographic method of increasing the surface area of storage electrode of a capacitor comprising the steps of:

providing a substrate having a gate, active and field-oxide regions therein;

depositing a layer of inter-poly oxide over said substrate;

etching a contact hole in said layer of inter-poly oxide;

depositing a layer of photoresist on said substrate;

patterning said layer of photoresist;

etching said layer of inter-poly oxide using said layer of photoresist as a mask and forming an in-line micro-folded electrode storage surface, wherein said in-line micro-folded surface comprises right circular cylinders each having a diameter between about 2,500 to 3,500 (Å) and height between about 4,000 to 6,000 (Å) arranged in-line with a spacing equal to its diameter;

forming a first layer of polysilicon over said in-line micro-folded electrode storage surface;

depositing a layer of dielectric insulation over said first layer of polysilicon; and forming a second layer of polysilicon over said layer of dielectric insulation to form a plate electrode of said capacitor.

2. The method of claim 1, wherein said layer of inter-poly oxide comprises tetraethyl orthosilicate (TEOS) with a thickness between about 8,000 to 12,000 angstroms (Å).

3. The method of claim 1, wherein said etching a contact hole in said layer of inter-poly oxide is accomplished with a recipe comprising $CHF_3$ at a flow rate between about 20 to 90 sccm, $CF_4$ at a rate between 30 to 120 sccm, and Ar at a rate between about 300 to 800 sccm.

4. The method of claim 1, wherein said patterning is accomplished by using microlithography.

5. The method of claim 1, wherein said first layer of polysilicon is doped with phosphorous and has a thickness between about 500 to 800 (Å).

6. The method of claim 1, wherein said layer of dielectric insulation comprises oxynitride.

7. The method of claim 1, wherein said second layer of polysilicon is doped with phosphorous.

8. A microlithographic method of increasing the surface area of storage electrode of a capacitor comprising the steps of:

providing a substrate having a gate, active and field-oxide regions therein;

depositing a layer of inter-poly oxide over said substrate;

etching a contact hole in said layer of inter-poly oxide;

depositing a layer of photoresist on said substrate;

patterning said layer of photoresist;

etching said layer of inter-poly oxide using said layer of photoresist as a mask and forming staggeredly micro-folded electrode storage surface, wherein said staggeredly micro-folded surface comprises right circular cylinders each having a diameter between about 2,500 to 3,500 (Å) and height between about 4,000 to 6,000 (Å) arranged staggeredly with a diagonal spacing equal to its diameter;

forming a first layer of polysilicon over said in-line micro-folded electrode storage surface;

depositing a layer of dielectric insulation over said first layer of polysilicon; and forming a second layer of polysilicon over said layer of dielectric insulation to form a plate electrode of said capacitor.

9. The method of claim 8, wherein said layer of inter-poly oxide comprises tetraethyl orthosilicate (TEOS) with a thickness between about 8,000 to 12,000 angstroms (Å).

10. The method of claim 8, wherein said etching a contact hole in said layer of inter-poly oxide is accomplished with a recipe comprising $CHF_3$ at a flow rate between about 20 to 90 sccm, $CF_4$ at a rate between 30 to 120 sccm, and Ar at a rate between about 300 to 800 sccm.

11. The method of claim 8, wherein said patterning is accomplished by using microlithography.

12. The method of claim 8, wherein said first layer of polysilicon is doped with phosphorous and has a thickness between about 500 to 800 (Å).

13. The method of claim 8, wherein said layer of dielectric insulation comprises oxynitride.

14. The method of claim 8, wherein said second layer of polysilicon is doped with phosphorous.

* * * * *